US005411822A

United States Patent [19]

Ohtake et al.

[11] Patent Number: 5,411,822

[45] Date of Patent: May 2, 1995

[54] SHADOW MASK FOR COLOR CATHODE RAY TUBE, SHADOW MASK PRINTING NEGATIVE PLATE USED FOR MANUFACTURE OF THE SHADOW MASK, AND METHOD AND MANUFACTURING THE NEGATIVE PLATE

[75] Inventors: Yasuhisa Ohtake; Seiji Sago; Yasushi Magaki, all of Fukaya, Japan

[73] Assignee: Kabushiki Kaisha Toshiba, Kawasaki, Japan

[21] Appl. No.: 108,520

[22] Filed: Aug. 18, 1993

Related U.S. Application Data

[62] Division of Ser. No. 796,346, Nov. 22, 1991, Pat. No. 5,280,215.

[30] Foreign Application Priority Data

| | | | |
|---|---|---|---|
| Nov. 22, 1990 | [JP] | Japan | 2-320424 |
| Nov. 22, 1990 | [JP] | Japan | 2-320425 |
| Nov. 22, 1990 | [JP] | Japan | 2-320426 |
| Nov. 22, 1990 | [JP] | Japan | 2-320427 |

[51] Int. Cl.$^{6}$ .................. G03F 9/00

[52] U.S. Cl. .................. 430/5; 430/23; 430/292; 430/302; 430/327

[58] Field of Search .................. 430/5, 23, 292, 302, 430/327; 313/403

[56] References Cited

U.S. PATENT DOCUMENTS

| | | | |
|---|---|---|---|
| 4,296,189 | 10/1981 | Kuzminski | 430/5 |
| 4,518,892 | 5/1985 | Thoms | 313/403 |
| 5,128,224 | 7/1992 | Ohtake et al. | 430/23 |

FOREIGN PATENT DOCUMENTS

| | | |
|---|---|---|
| 2906611 | 8/1980 | Germany . |
| 50-124253 | 10/1975 | Japan . |
| 55-159545 | 12/1980 | Japan . |
| 56-156636 | 12/1981 | Japan . |
| 63-49336 | 10/1988 | Japan . |
| 1175148 | 7/1989 | Japan . |
| 240840 | 2/1990 | Japan . |
| 286027 | 3/1990 | Japan . |
| 2226695 | 11/1989 | United Kingdom . |

OTHER PUBLICATIONS

Patent Abstract of Japan, Appln. No. 63-153275, Matsushita Electron Corp., Dec. 26, 1989.

Patent Abstract of Japan, Appln. No. 63-311506, Dainippon Printing Co. Ltd., Mar. 27, 1990.

*Primary Examiner*—S. Rosasco

*Attorney, Agent, or Firm*—Cushman Darby & Cushman

[57] ABSTRACT

A shadow mask includes a mask substrate having vertical and horizontal axes passing through a center of the substrate, and a number of substantially rectangular apertures. The apertures are arranged so that a plurality of vertical trains of apertures extending parallel to the vertical axis are arranged at predetermined intervals in the direction of the horizontal axis. Each of the apertures other than the apertures located on the vertical axis has a pair of outer corners distant from the vertical axis, a pair of inner corners less distant from the vertical-axis side, and a pair of bulging portions extending from the outer corners, respectively, outward in the horizontal direction. The farther each of the apertures is located from the vertical axis, the longer the bulging portions extend outward.

10 Claims, 10 Drawing Sheets

SHADOW MASK FOR COLOR CATHODE RAY TUBE, SHADOW MASK PRINTING NEGATIVE PLATE USED FOR MANUFACTURE OF THE SHADOW MASK, AND METHOD AND MANUFACTURING THE NEGATIVE PLATE

This is a division of application Ser. No. 07/796,346, filed Nov. 22, 1991, now U.S. Pat. No. 5,280,215.

BACKGROUND OF THE INVENTION

1. Field of the Invention

The present invention relates to a shadow mask for a color cathode ray tube, and more particularly, to a shadow mask enjoying satisfactory luminance and white uniformity and having substantially rectangular apertures, a shadow mask printing negative plate used for the manufacture of the shadow mask, and a method for manufacturing the negative plate.

2. Description of the Related Art

In general, a color cathode ray tube comprises an envelope including a panel having a spherical surface, and a funnel joined integrally to the panel. A phosphor screen composed of three-color phosphor layers is formed on the inner surface of the panel. A shadow mask, which has a large number of apertures disposed in a specific pattern, is arranged inside the phosphor screen so as to face the same. Three electron beams, which are emitted from an electron gun located in a neck portion of the funnel, are deflected by a magnetic field generated by means of a deflection yoke, which is mounted outside the funnel. Thereafter, the electron beams are selected by means of the shadow mask so as to land properly in desired positions on the three-color phosphor layers. Then, the electron beams are scanned in the horizontal and vertical directions by means of the magnetic fields, whereby a color picture is displayed on the fluorescent screen.

Conventionally, the apertures of shadow masks of this type may be circular or rectangular in shape. Shadow masks having circular apertures are used mainly in display tubes, while ones having rectangular apertures are adapted principally for household use, such as home TV sets.

Conventionally, each aperture of a rectangular-aperture shadow mask is formed so that the direction of its longitudinal axis is in alignment with that of the vertical axis of the shadow mask. In particular, a plurality of apertures are arranged along the vertical axis, which passes through the center of the shadow mask, with narrow bridge portions between them, and a plurality of aperture trains, each extending in the direction of the vertical axis, are arranged side by side at predetermined pitches in the horizontal direction. The phosphor screen is provided with a plurality of trios of stripe phosphor layers corresponding to this shadow mask, each extending in the vertical direction.

A shadow mask having the apertures arranged in the specific pattern described above is manufactured by photoetching. More specifically, a sensitizing solution is applied to both sides of a mask substrate to form photo resist films, and a pair of shadow mask printing negative plates, having patterns corresponding to the apertures to be formed, are bonded individually to the photo resist films to effect printing (exposure) and development. Thus, resist patterns corresponding to the patterns on the negative plates are formed on the mask substrate. Thereafter, the mask substrate, having the resist patterns thereon, are etched from both sides, whereupon the shadow mask is completed.

The apertures of the shadow mask manufactured by this method are only approximately rectangular apertures they have four round corners, due to sagging of the patterns after the printing and development or difference in etching speed. Each of apertures in the negative plates used to print the patterns on the photo resist films however, has an accurate rectangular form and no roundness in its four corners. The etching method allowing substantially rectangular smaller openings having four round corners to be formed on one side of the mask substrate, while substantially rectangular larger openings having four round corners and communicating with the smaller openings are formed on the other side of the substrate. Each aperture is defined by the boundary between its corresponding smaller and larger openings. Projecting portions, which project toward the aperture, are formed at the boundary between the smaller and larger openings.

Generally, the shadow mask is arranged inside the panel in a manner such that the smaller openings are situated on the electron-gun side, and the larger openings face the phosphor screen. Therefore, those electron beams which irradiate the three-color phosphor layers at the central portion of the phosphor screen reach the screen after passing through the apertures at the central portion of the shadow mask in a direction substantially parallel to the axis of the apertures. However, those electron beams which land on the phosphor layers at the peripheral portion of the phosphor screen reach the screen after being positively deflected and diagonally traversing the apertures at the peripheral portion of the mask. Part of each electron beam thus diagonally traversing the apertures runs against the open edge portions (on the fluorescent-screen side) of the larger openings or inner aperture walls, and fails to reach the phosphor screen. Accordingly, luminous regions on the three-color phosphor layers which are formed corresponding to the respective configurations of the apertures are not rectangular, and have cutouts at the corners thereof. Thus, the luminance and white uniformity are lowered. Further, the beams reflected by the inner walls of the apertures may cause a different-color fluorescent layer to glow, thereby lowering the intensity of color or contrast.

In the case of an aperture which has the projecting portions at the boundary between the smaller and larger openings, in particular, the position for the formation of the projecting portions on the short-side portions of the aperture is shifted in the thickness direction of the mask from that of the projecting portions on the long-side portions, depending on the variation of the etching speed. Usually, the projecting portions at the short-side portions of the aperture are situated on the phosphor-screen side (on the side of the larger opening edge) of the ones at the long-side portions of the aperture. These projecting portions form stepped portions at the four corners of the aperture or the boundaries between the short- and long-side portions. More specifically, projecting portions situated on the phosphor screen side of the ones at the long-side portions are formed individually at the four corners of the aperture. If the electron beams diagonally traverse the apertures having these projecting portions, therefore, they are substantially intercepted by the outer corners of the apertures nearer to the outer peripheral portion of the shadow mask, so that the luminance and white uniformity are further lowered.

This problem is liable to arise, in particular, in the case of a flat square tube in which the panel has a substantially flat surface with a large radius of curvature. Namely, the radius of curvature of the shadow mask increases depending on that of the panel. In order to prevent the mechanical strength of the shadow mask from being lowered by the increase in the radius of curvature, the thickness of the mask must be increased. In the case of the shadow mask for the flat square tube, therefore, the electron beams diagonally traverse the apertures of the mask at a larger angle even though they deflect at the same deflection angle as in the case of use in a conventional color cathode ray tube. Thus, the electron beams are liable to run against the screen-side open edge portions of the apertures or inner aperture walls, so that the luminance and white uniformity are additionally lowered.

An off-center shadow mask is conventionally provided in order to prevent a cutout of each luminous region attributable to the collision of the electron beams which diagonally traverse each aperture. In the shadow mask of this type, the central portion of the mask has apertures formed so that the respective central axes of the smaller and larger openings are in alignment. As the peripheral portion of the shadow mask with respect to the horizontal direction is approached, the position of each larger opening is deviated outward with respect to its corresponding smaller opening. As the peripheral portion of the shadow mask with respect to the diagonal direction is approached, moreover, the position of the larger opening is deviated in the diagonal direction with respect to the smaller opening.

If the deviation of the larger opening with respect to the smaller opening is increased, however, the aperture configuration deforms. In the case of the flat square tube in which the panel has a substantially flat surface with a larger radius of curvature than that of the panel of a conventional color cathode ray tube, in particular, the radius of curvature of the shadow mask increases in proportion to that of the panel. As the size of the color cathode ray tube increases, therefore, the mechanical strength of the shadow mask considerably lowers, so that the shadow mask is expected to be relatively thick. In the shadow mask of this type, the electron beams which diagonally traverse the apertures run against the inner surface of each aperture, even though they do not in the case of the conventional shadow mask. Further, the aperture width as viewed from the path of the deflected electron beams is reduced, so that the luminous regions on the phosphor layers are narrowed, thus entailing lowered luminance. In order to avoid the collision of the electron beams and the lowering of the luminance, it is necessary only that the deviation ΔW of the larger openings with respect to the smaller openings be increased. If the deviation ΔW of the larger openings is increased, however, the height of each projecting portion on the right-side of each aperture is so different of that of each projecting portion on the left-side that the aperture configuration is further distorted.

Published Examined Japanese Patent Application No. 63-49336 discloses a shadow mask in which all the corners of larger and smaller openings are projected outwardly so that the openings are spool-shaped, in order to reduce the roundness of the four corners of each aperture. One embodiment in particular describes a version in which the difference in size between the larger and smaller openings with respect to the direction of the aperture width is equal to that with respect to the direction of the aperture length.

In order to prevent electron beams from being intercepted at the larger openings in the direction of the aperture width in the shadow mask constructed in this manner, however, the width of the bridge portions at the respective open edge portions (on the fluorescent-screen side) of the larger openings must be increased. As a result, the substantial width of the bridge portions at the projecting portions is increased. This lowers the luminance. In order to reduce the substantial width of the bridge portions, in contrast with this, the width of the bridge portions at the open edge portions of the larger openings must be reduced. As a result, the electron beams are intercepted to a higher degree at the open edge portions of the larger openings or projecting portions, so that the luminance and white uniformity are lowered. Moreover, if the construction of the shadow mask of this type is made similar to that of a conventional shadow mask in which the difference in size between the larger and smaller openings with respect to the direction of the aperture width is greater than that with respect to the direction of the aperture length, very large stepped portions are formed at the four corners of each aperture or the boundaries between the short- and long-side portions of the aperture. Accordingly, even though the shape of the aperture is rectangular as viewed from just above the aperture, the electron beams which diagonally traverse the apertures are intercepted by the stepped portions at the outer corners of the apertures nearer to the outer peripheral portion of the shadow mask, and luminous regions on three-color phosphor layers are subject to cutouts, so that the luminance and white uniformity are lowered.

Published Unexamined Japanese Patent Application No. 1-175148 discloses a shadow mask in which the corners of larger openings are projected outwardly so that electron beams can be prevented from being intercepted at the corners of apertures. This shadow mask, however, differs from the one disclosed in published Examined Japanese Patent Application No. 63-49336 only in the configuration of each larger opening, and the substantial shape of the apertures is same as that of the above Application, thus being subject to like problems.

Published Unexamined Japanese Utility Model Application No. 50-124253, moreover, discloses a shadow mask in which the central portion of each short side of each aperture is bulged inward so that the roundness of an end portion of an electron beam (cutout of each corner of a luminous region on a phosphor layer) caused by diffusion is eliminated to make the electron beam configuration rectangular. In the case of this shadow mask, however, if apertures are formed with bridge portions having a predetermined width left at the respective open edges of larger and smaller openings, the width of the bridge portions is so great that the luminance is low. In order to maintain the luminance level, however, the width of the bridge portions must be considerably reduced, so that the mechanical strength of the shadow mask with respect to the direction of aperture trains, each including a plurality of apertures arranged with the bridge portions between them, lowers. In press-molding the shadow mask into a predetermined shape, therefore, the mask undergoes local elongation or distortion. Thus, the desired shadow mask cannot be obtained.

Disclosed in Published Unexamined Japanese Patent Application No. 1-320738, furthermore, is a shadow mask in which larger openings are substantially rectangular, the outer corners of smaller openings are bulged, and the outer corners of apertures are also bulged so that electron beams diagonally traversing the apertures can be prevented from running against the open edge portions of the larger openings or inner aperture walls, and cutouts of luminous regions on three-color fluorescent layers can be prevented. Published Unexamined Japanese Patent Application No. 2-86027, moreover, discloses patterns of a shadow mask printing negative plate for forming those apertures. In this case, patterns corresponding to smaller openings are formed by combining rectangular main patterns and rectangular auxiliary patterns by composite exposure.

In the shadow mask of this type, although the white uniformity can be positively restrained from being lowered by cutouts of luminous regions, the roundness of the corners of apertures cannot be reduced, so that the luminance cannot be satisfactorily improved. At the outer peripheral portion of a phosphor screen where the allowance for electron beam landing is small, moreover, electron beams passing through bulging portions of the apertures are applied to fluorescent layers of different colors, and are liable to lower the color intensity.

Published Unexamined Japanese Patent Application No. 2-40840 discloses a shadow mask in which the four corners of each smaller opening are bulged outward, and the inner wall of the short-side portion of the smaller opening is slanted so that the roundness of the four corners of the aperture is reduced. In this shadow mask, however, the short-side portion of each aperture is arcuate and includes no straight portion, so that the aperture area is too small to obtain a satisfactory luminance. Since larger openings are arranged in the same manner as those of conventional apertures, moreover, the corners of the apertures cannot be easily bulged outward.

Published Unexamined Japanese Patent Application No. 55-159545 discloses a shadow mask printing negative plate whose apertures are I-shaped so that the four corners of the apertures are bulged outwardly. In a shadow mask formed by using the negative plate constructed in this manner, the outer corners of each aperture are bulged so that lowering of the white uniformity, which is caused by the collision of electron beams diagonally traversing the apertures, can be restrained in some measure. Since the apertures are formed so that larger openings are substantially rectangular and the corners of smaller openings are bulged outwardly, however, the roundness of the four corners of each aperture cannot be reduced, so that the luminance cannot be satisfactorily restrained from being lowered.

Published Unexamined Japanese Patent Application No. 56-156636 discloses a shadow mask printing negative plate in which each aperture has projecting portions sharply projecting for several tens of microns from its four corners individually. A shadow mask formed by using the negative plate constructed in this manner can be designed so that its apertures are each in the form of a rectangle having four corners with reduced roundness. However, no bulging portions are formed at the outer corners of the apertures against which electron beams are liable to run as they diagonally traverse the apertures. With these apertures, therefore, cutouts of luminous regions cannot be prevented, so that the white uniformity is lowered.

Although various improved shadow masks have been described above, their luminance and/or white uniformity can be improved only to some degree, and not satisfactorily.

SUMMARY OF THE INVENTION

The present invention has been contrived in consideration of these circumstances, and its object is to provide a shadow mask having rectangular apertures whose corners are reduced in roundness and are free of cutouts of luminous regions which may otherwise be caused by electron beams diagonally traversing the apertures with increase of deflection. In this way the luminance and white uniformity can be improved. Another object of the present invention is to provide a shadow mask printing negative plate used for the manufacture of the shadow mask, and a method for manufacturing the negative plate.

In order to achieve the above object, according to the present invention, there is provided a shadow mask which comprises a substantially rectangular mask substrate, and a number of apertures formed in the mask substrate, and in which the configurations of apertures, especially the bulges of bulging portions, are different depending on coordinate positions on the shadow mask. The farther each of the apertures is located from the center of the shadow mask in the horizontal direction, the longer outer bulging portions of the apertures extend outwardly. The farther each of the apertures is located from the center of the shadow mask in the horizontal direction, the shorter inner bulging portions of the apertures extend outwardly. Thus, the apertures are symmetrical with respect to the longitudinal direction and asymmetrical with respect to the transverse direction.

Preferably, the four corners of each of those apertures which are located on a vertical axis passing through the center of the shadow mask transversely bulge so that each aperture is symmetrical with respect to the longitudinal and transverse directions. Of the bulging portions of the outer corners of each aperture, the one located farther from the center of the shadow mask extends longer than the one located closer to the center of the mask. The inner corners of the apertures have no bulges so that each aperture nearer to the outer peripheral portion of the shadow mask is asymmetrical with respect to the longitudinal and transverse directions.

According to the shadow mask constructed in this manner, the aperture configuration, as viewed from the path of an electron beam diagonally traversing the apertures with increased deflection, can be made substantially accurately rectangular. Accordingly, a cutout of a luminous region on a fluorescent layer, which has conventionally been caused when part of the electron beam diagonally traversing the apertures runs against the screen-side edge portions or inner walls of the apertures and fails to reach a phosphor screen, can be eliminated. Thus the lowering of the luminance and white uniformity of the shadow mask with rectangular apertures which may be caused in the conventional case can be prevented. There is a greater allowance for the electron beams to land on the phosphor layers at the central portion of the phosphor screen than at the peripheral portion. Even if the four corners of each aperture on the vertical axis passing through the shadow mask center transversely bulge so that the aperture is symmetrical with respect to the longitudinal and transverse directions, therefore, the luminance at the central portion of the phosphor screen can be improved without entailing a color shift.

According to the present invention, moreover, there is provided a shadow mask printing negative plate used for forming, in a mask substrate, a number of substantially rectangular apertures having plane configurations varying depending on the position on the mask substrate. The negative plate includes smaller-opening patterns, which correspond individually to smaller openings formed on one side of the mask substrate and each constituting part of the corresponding aperture, and larger-opening patterns, which correspond individually to larger openings formed on the other side of the mask substrate. In this negative plate, each of the smaller- and larger-opening patterns is formed of a rectangular main pattern and rectangular projecting patterns individually protruding outwardly from the corners of the main pattern.

In a method for manufacturing the shadow mask printing negative plate, the smaller- and larger-opening patterns are formed by composing the rectangular projecting patterns individually at the corners of each main pattern by composite exposure, and suitably varying the respective widths, lengths, and projection angles of the projecting patterns and the projecting positions thereof relative to each main pattern.

If the smaller- and larger-opening patterns of the shadow mask printing negative plate are each formed of the rectangular main pattern and the rectangular projecting patterns individually protruding outwardly from the corners of the main pattern, as described above, the corners of the apertures of the shadow mask can be bulged by a desirable distance. Thus, by assembling the shadow mask in a color cathode ray tube, the whole phosphor screen can be radiated by electron beams each having a substantially rectangular configuration without a cutout.

If the rectangular main pattern and the rectangular projecting patterns individually protruding outward from the corners of the main pattern are synthetically formed by composite exposure, moreover, patterns of desired configurations can be easily obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 7 show a shadow mask according to one embodiment of the present invention, in which FIG. 1 is a sectional view of a color cathode ray tube having the shadow mask, FIG. 2 is a plan view of the shadow mask, FIG. 7 is a schematic view for illustrating the relationship between the configuration of an aperture having bulging portions at the four corners thereof, as viewed from the path of an electron beam diagonally traversing the aperture, and a luminous region on the phosphor layer;

FIGS. 8A to 13E show negative plates for shadow mask printing according to the one embodiment of the invention, in which FIG. 8A is a plan view of a negative plate for forming smaller openings, FIGS. 13A to 13E are schematic views individually showing processes for forming a larger-opening pattern;

DETAILED DESCRIPTION OF THE PREFERRED EMBODIMENTS

A shadow mask according to one embodiment of the present invention will now be described in detail with reference to the accompanying drawings.

Figure 1:
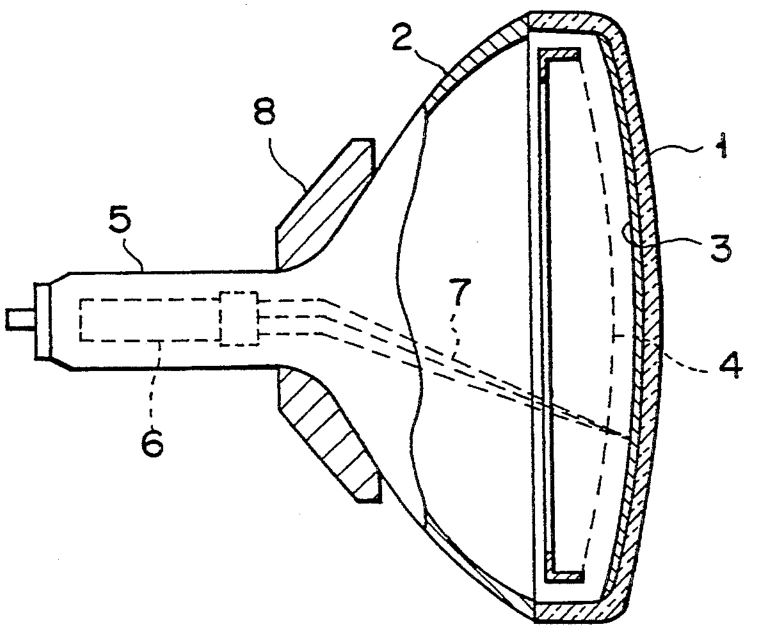

FIG. 1 shows a color cathode ray tube which comprises an envelope which includes a panel 1 having a spherical surface and a funnel 2 joined integrally with the panel. A phosphor screen 3 having three-color phosphor layers is formed on the inner surface of the panel 1. A shadow mask 4, which has a large number of apertures arranged in a specific pattern, is arranged inside the phosphor screen 3 so as to face the same. Three electron beams, which are emitted from an electron gun 6 located in a neck portion 5 of the funnel 2, are deflected by a magnetic field generated by means of a deflection yoke 8, which is mounted outside the funnel. Thereafter, the electron beams are selected by means of the shadow mask 4 so as to land properly in desired positions on the three-color fluorescent layers.

Figure 2:
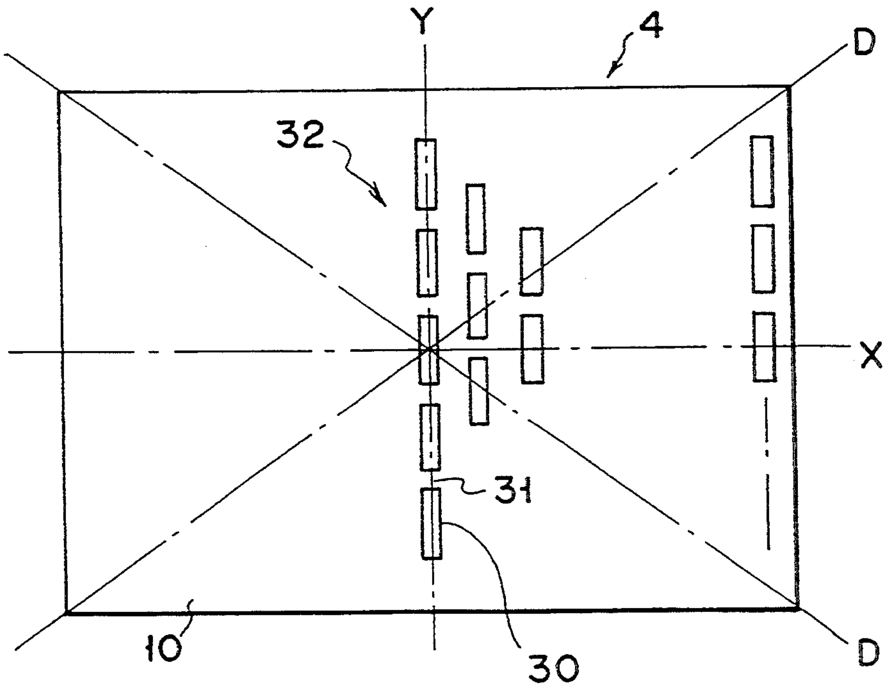

The shadow mask 4 includes a mask substrate 10 which has a rectangular shape as viewed in the front and has a vertical axis (Y axis) and a horizontal axis (X axis) which pass through the center of the mask substrate, as shown in FIG. 2. The mask 4 has a large number of substantially rectangular apertures 30, which are formed in the mask substrate 10 so that their longitudinal-axis direction is coincident with the Y-axis direction of the mask. The apertures 30 are vertically arranged with narrow bridge portions 31 between them. A plurality of vertical aperture trains 32 are arranged at predetermined intervals in the horizontal direction (X-axis direction), thus forming a pattern.

The shadow mask apertures 30 are formed by photoetching. Specifically, as shown in FIGS. 3A to 3D, for example, a large number of larger openings 34 are formed on that face of the mask substrate 10 which opposes the phosphor screen when the shadow mask 4 is set in the color cathode ray tube. A large number of smaller openings 35 are formed on the opposite face of the mask substrate. Each larger opening 34 communicates with the corresponding smaller opening 35, so that each aperture 30 is defined by the boundary between the larger opening 34 and the corresponding smaller opening 35.

The planar configuration of the apertures 30 are different depending on their coordinate positions on the shadow mask. Apertures 30 that are located on and near the vertical axis Y which passes through the center (x=0) of the shadow mask 4 are shown in FIGS. 3A to 3D. In these apertures, all four corners 36L of each larger opening 34 and four corners 36S of each smaller opening 35 bulge transversely outwardly by substantially equal amounts. Accordingly, all four corners 36 of each aperture 30 bulge transversely outward so that each of these apertures is symmetrical with respect to the longitudinal and transverse directions, having four bulging portions 37 one at each corner, all of substantially the same size.

Figure 4A:
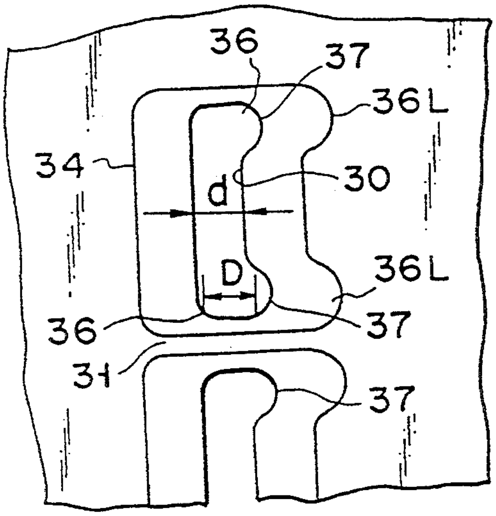
Figure 4B:
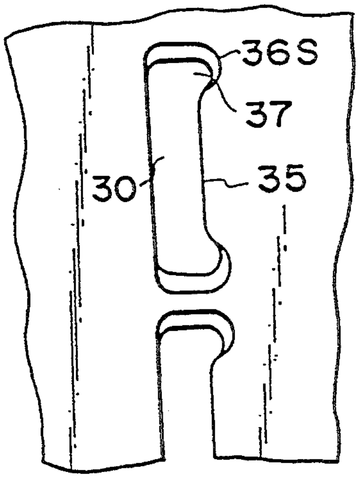
Figure 5A:
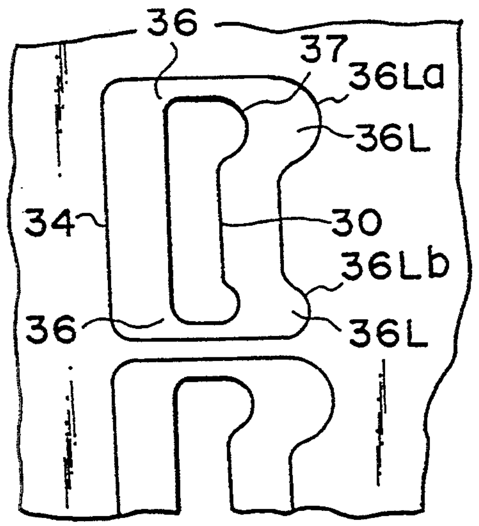
FIGS. 5A and 5B are plan views showing the larger opening configuration and smaller opening configuration, respectively, of apertures on a diagonal axis of the shadow mask.
Figure 5B:
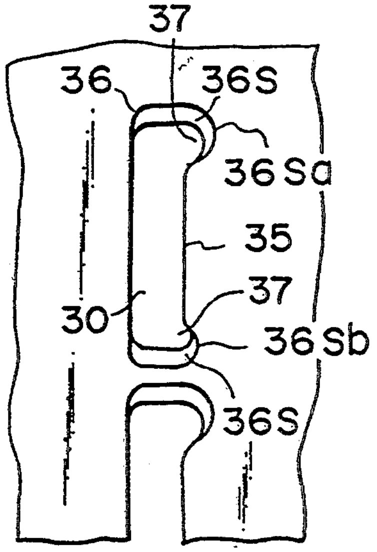

The apertures alone are horizontal axis X shown in FIGS. 4A and 4B. These apertures are dimensioned such that the farther each of the apertures is located from the center (x=0) of the mask that is the closer the outer periphery thereof, the longer are the horizontal bulges of the two corners 36L of the larger opening 34 on the side of the outer periphery of the shadow mask 4. The two outer peripheral corners 36S of the smaller opening 35 on the outer peripheral side of the mask also extend in a similar way, so the outer corners 36L and 36S each, extend outward. Accordingly, a pair of bulging portions 37, including an upper and a lower portion, of substantially the same size, extend transversely outward from their corresponding outer corners 36 of each aperture 30. The farther each of the apertures is located from the center of the shadow mask, the longer are these bulging portions 37 which extend outward. The farther each of the apertures 30 is located from the center of the mask 4 to the outer periphery thereof, the shorter the bulging portions of the corners 36L and 36S of the larger and smaller openings 34 and 35 on the side of the center of the shadow mask 4, that is, the inner corners 36L and 36S, extend outward. The inner corners of the apertures 30 located at a position substantially halfway between the center and outer periphery of the mask 4 have no bulging portions. Thus, those apertures 30 which are distant from the center have no bulges at the inner corners, and their configuration is symmetrical with respect to the longitudinal direction and asymmetrical with respect to the transverse direction. The configuration of the apertures 30 located on an intermediate axis of the mask 4, e.g., a diagonal axis such as D axis in FIG. 2, will now be described. FIGS. 5A and 5B show one of these apertures 30. The outer corners 36La, 36Lb, 36Sa, 36Sb of each of the larger and smaller openings 34 and 35 have horizontal bulges extending outwardly. The horizontal bulges of the outer corners 36La and 37Sa, which are farther from the shadow mask center (x=0 or the Y axis) than the outer corners 36Lb and 36Sb of the openings 24 and 35, are longer than the bulges of the outer corners 36Lb and 36Sb. Each of the apertures 30 has a pair of bulging portions 37 extending outwardly from the outer corners thereof. The bulging portion 37 of that outer corner of each aperture 36 which is farther from the shadow mask center than the other outer corner is greater than the bulging portion of the other outer corner. The bulges of the inner corners of the larger and smaller openings 34 and 35 become smaller with distance from the Y axis, and are finally reduced to zero. Thus, the aperture 30 on the diagonal axis and remote from the center of the shadow mask have no bulges at the inner corners thereof, and their configuration is asymmetrical with respect to the longitudinal and transverse directions.

Thus, in the apertures 30 of the shadow mask 4, the farther the aperture 30 is located from the center of the shadow mask 4 in the X-axis direction, the longer the bulges of the two outer corners extend outward. The farther the aperture 30 is located from the X axis in the Y-axis direction, the longer the bulge of the outer corner located farther from the X axis extends outwardly.

The distribution of the apertures 30, whose configuration varies depending on their coordinate positions on the shadow mask 4, is symmetrical with respect to the horizontal and vertical axes X and Y, and is uniform for each of four regions divided by the horizontal and vertical axes.

The configuration of each aperture 30, especially the size of its bulging portions 37, are different depending on the type and size of the color cathode ray tube, thickness of the shadow mask 4, size of the aperture, etc. Generally, however, it is best to adjust the bulging length of each bulging portion 37 to 30% or less of the width (horizontal length) of the aperture 30 at the center thereof.

FIG. 4A shows, moreover, the bulging portion 37 is formed so that the length D of a straight portion of the side edge of each aperture 30 adjacent to the bridge portion 31 is equal to or greater than the width d of the central portion of the aperture. Therefore, satisfactory luminance can be obtained despite the roundness of the corners 36 of the aperture 30.

By using the apertures 30 formed in this manner, the luminance at the central portion of the phosphor screen 3, which corresponds to the central portion of the shadow mask 4, can be made higher than that of a conventional shadow mask. Also, a cutout of the luminous region at the outer peripheral portion of the phosphor screen 3 can be substantially removed, so that lowering of the luminance and white uniformity, which may be caused by a cutout of the luminous region in the case of the conventional phosphor screen, can be satisfactorily restrained.

Usually, the phosphor screen 3 of the color cathode ray tube in which the rectangular-aperture shadow mask is incorporated, has three-color phosphor layers in the form of stripes, vertically extending corresponding to the aperture trains 32 of the mask 4. Therefore, although landing deviations of the electron beams on the three-color phosphor layers cover the whole region of the screen and hardly arouse any problem with respect to the vertical direction, horizontal landing deviations cause a substantial problem. However, there is a good allowance for landing at the central portion of the phosphor screen 3 with respect to the horizontal direction. Therefore, even though the luminous region is widened by providing the transverse outward bulging portions 37 at the four corners 36 of each aperture 30 in the central portion of the shadow mask 4, as mentioned before, a color shift attributable to landing on a different-color phosphor layer can be prevented.

Figure 6A:
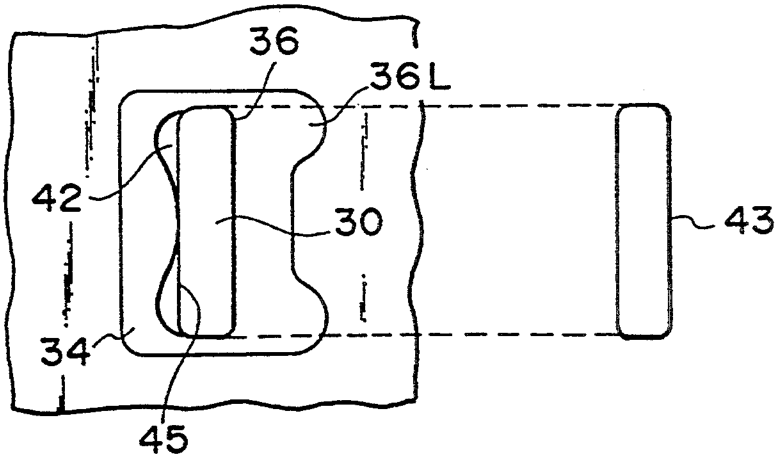
FIG. 6A is a schematic view for illustrating the relationship between the configuration of an aperture at the peripheral portion of the shadow mask with respect to the horizontal direction, as viewed from the path of an electron beam diagonally traversing the aperture, and a luminous region on a phosphor layer.
Figure 6B:
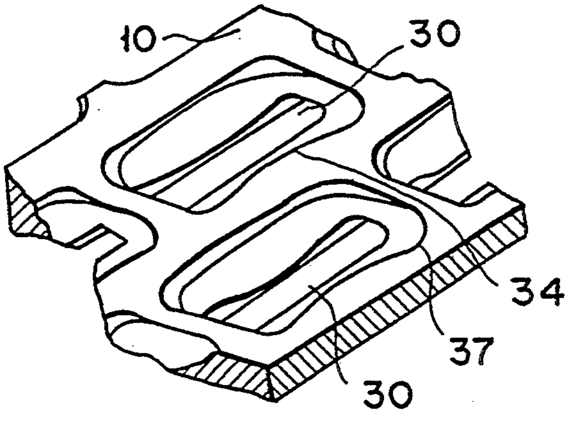
FIG. 6B is a perspective view of the aperture shown in FIG. 6A.

For the outer peripheral portion of the phosphor screen 3 with respect to the horizontal direction, on the other hand, the electron beams are deflected so that they diagonally traverse the apertures 30 and are landed on the phosphor layers. The incident angle of the beams increases in proportion to the increase of the deflection. The apertures 30 of the shadow mask 4 through which pass the electron beams to land on the phosphor layers at the outer peripheral portion of the phosphor screen 3 are symmetrical with respect to the longitudinal direction and asymmetrical with respect to the transverse direction, having their outer corners 36 bulging, as shown in FIG. 4A. If these apertures 30 are frontally viewed, from the path of the electron beams, they look symmetrical with respect to the longitudinal and transverse directions, as shown in FIGS. 6A and 6B. More specifically, in this case, the bulging portions 37 on the side of the outer peripheral portion of the shadow mask are unseen, and apparently, the corners 36 of the apertures 30 are sharper or less round. As shown in FIGS. 3C and 3D, moreover, with respect to the direction of thickness of the shadow mask 4, the position of each projecting portion 44 at the boundary between the larger and smaller openings 34 and 35 is one for the long-side portions and another for the short-side portions, and there are stepped portions at the four corners of each aperture, by the projecting portions on the long- and short-side portions. If viewed from the path of the electron beams, therefore, although an inner-side inner wall 42 of the smaller opening 35 looks undulating due to the existence of the projecting portions 44, the aperture configuration is defined by an aperture edge 45 of the smaller opening 35, as shown in FIGS. 6A and 6B. Thus, the shape of the luminous region 43 on the phosphor layer can be approximated to an entire rectangle with its four corners less round.

For those apertures 30 situated at a distance from the horizontal axis (X axis) toward the outer periphery side of the shadow mask 4, the position of each projecting portion at the boundary between the larger and smaller openings is one for the long-side portions and another for the short-side portions, and there are stepped portions at the four corners of each aperture, as mentioned before. Since the apertures 30 are asymmetrical with respect to the longitudinal and transverse directions, as shown in FIG. 5A, however, the bulging portions 37 on the side of the outer peripheral portion of the shadow mask are unseen, as viewed from the path of the electron beams, the influence of the stepped portions at the aperture corners of the projecting portions is removed, and apparently, the corners are sharper or less round. On the inner side of the apertures 30, as in the case of the apertures 30 shown in FIG. 4A, which are symmetrical with respect to the longitudinal direction and asymmetrical with respect to the transverse direction, the inner wall of the smaller opening 35 looks undulating due to the existence of the stepped portions at the aperture corners of the projecting portions. If viewed from the path of the electron beams, however, the aperture configuration is defined by the aperture edge of the smaller opening. Thus, the shape of the luminous region on the phosphor layer can be approximated to a rectangle with its four corners less round.

Figure 3A:
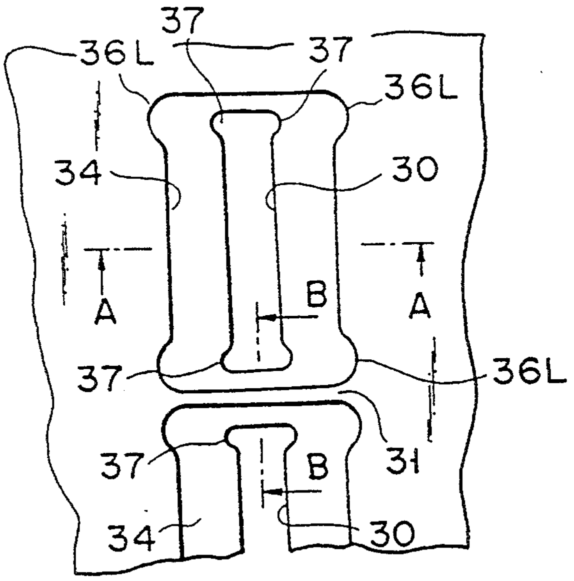
FIG. 3A is a plan view showing the larger opening configuration of apertures on the vertical axis of the shadow mask.
Figure 3B:
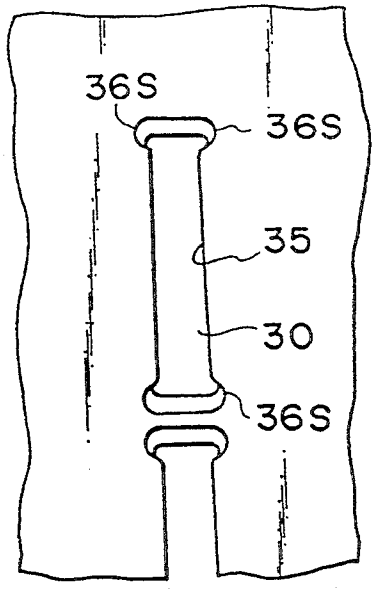
FIG. 3B is a plan view showing the smaller opening configuration of the apertures on the vertical axis.
Figure 3C:
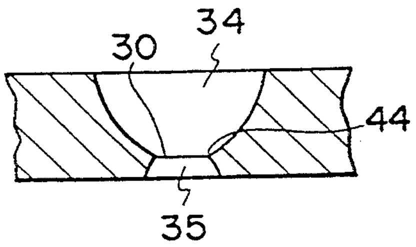
FIG. 3C is a sectional view taken along line A—A of FIG. 3A.
Figure 3D:
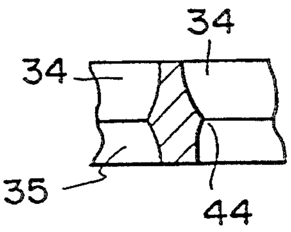
FIG. 3D is a sectional view taken along line B—B of FIG. 3A, FIGS. 4A and 4B are plan views showing the larger opening configuration and smaller opening configuration, respectively, of apertures on the horizontal axis of the shadow mask.
Figure 7:
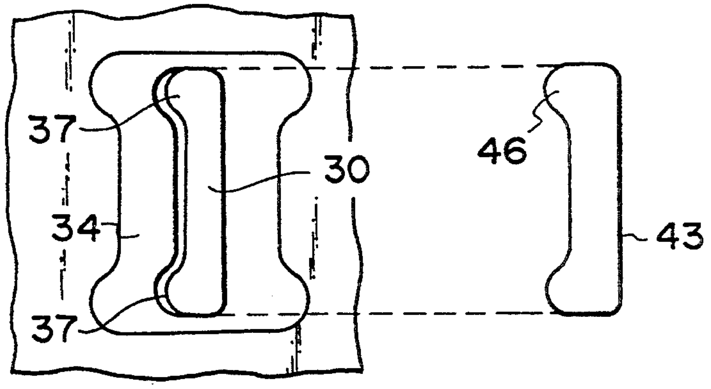

Let it be supposed that those apertures which are situated on the horizontal and diagonal axes X and D of the shadow mask 4 are formed into a configuration symmetrical with respect to the longitudinal and transverse directions and having the outward bulging portions 37 at the four corners, as in the case of the apertures situated on the vertical axis Y or thereabouts, as shown in FIG. 3A. In this case, if the apertures 30 are viewed from the path of the electron beams which diagonally traverse the apertures, the outer bulging portions are unseen, as shown in FIG. 7, and there is no problem, as in the cases of the apertures on the horizontal and diagonal axes. However, the bulging portions 37 appear inside each aperture 30, so that the aperture looks considerably distorted. As a result, the luminous region 43 on the phosphor screen 3 is distorted so that it has bulging portions 46, which cause a different-color phosphor layer to glow, thus entailing a color shift and lowering the white uniformity. For a phosphor screen which has a stripe-shaped light absorbing layer between three-color fluorescent layers, the light absorbing layer cannot be formed straight, so that there may be some problems, such as irregular external appearance.

According to the shadow mask constructed in this manner, a cutout of the luminous region 43 at the outer peripheral portion of the screen 3, which has been caused in the prior art, is eliminated by changing the configurations of the apertures 30, especially the bulges of the bulging portions 37, depending on the coordinate positions of the shadow mask. By doing this, the luminance or white uniformity can be prevented from lowering, and the luminance at the central portion of the screen 3 can be improved without entailing a color shift. Accordingly, the shadow mask of this embodiment can be effectively applied to rectangular aperture shadow masks for a normal color cathode ray tube, and for a flat square tube which has a greater thickness and larger radius of curvature than the shadow mask of the normal color cathode ray tube and in which electron beams deflected by the same angle as in the normal tube traverse the apertures 30 with a greater incident angle.

The apertures 30 of the shadow mask 4 with the aforementioned construction are formed by photoetching. More specifically, a sensitizing solution is applied to both sides of a mask substrate to form photo resist films, and negative plates or shadow mask printing negative plates are bonded to these photo resist films. Then, the photo resist films with the negative plates are exposed and developed. Thus, resist patterns having exposed portions corresponding to the negative patterns are formed on both sides of the mask substrate. Thereafter, the mask substrate, having the resist patterns thereon, are etched from both sides, whereby a large number of apertures are formed.

The following is a description of the shadow mask printing negative plates and a method for manufacturing the same.

Figure 8A:
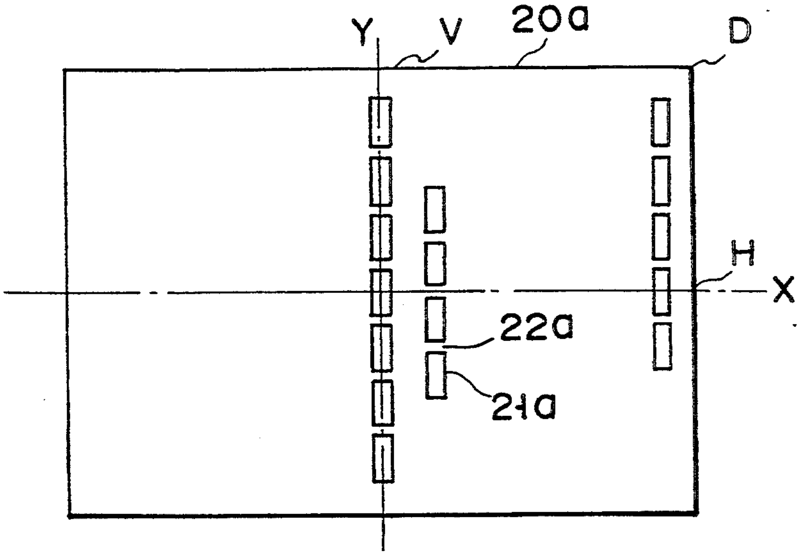
Figure 8B:
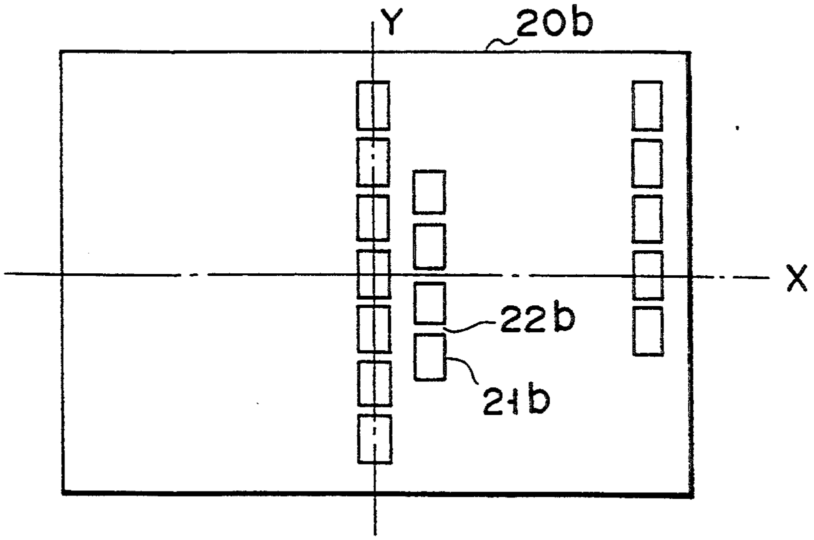
FIG. 8B is a plan view of a negative plate for forming larger openings.

As shown in FIGS. 8A and 8B, the shadow mask printing negative plates include a smaller-opening negative plate 20*a* for forming smaller openings 35 on one side of the mask substrate, and a larger-opening negative plate 20*b* for forming larger openings 34 on the other side of the mask substrate. The paired negative plates 20*a* and 20*b* for smaller and larger openings have smaller-opening patterns 21*a* and larger-opening patterns 21*b* (mentioned later) corresponding to the apertures 30 of the rectangular-aperture shadow mask. These patterns 21*a* and 21*b* are arranged in the vertical direction (Y-axis direction) with narrow bridge portions 22*a* and 22*b* between them. A plurality of vertical aperture trains are arranged at predetermined pitch in the horizontal direction (X-axis direction).

Figure 9A:
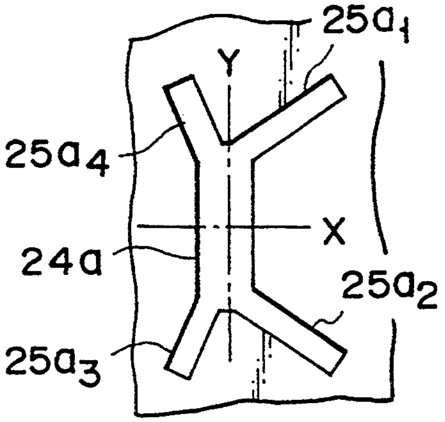
FIG. 9A is a plane view showing an example of a smaller-opening pattern.
Figure 9B:
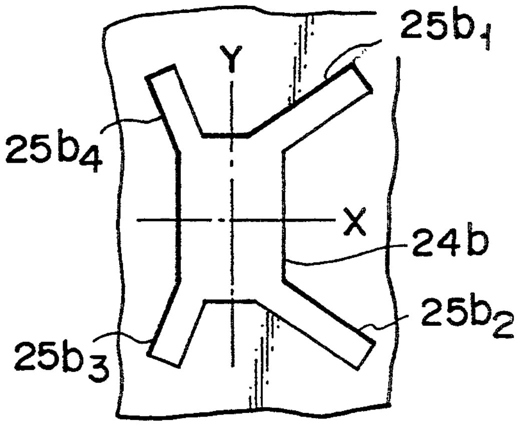
FIG. 9B is a plane view showing an example of a larger opening pattern.
Figure 10A:
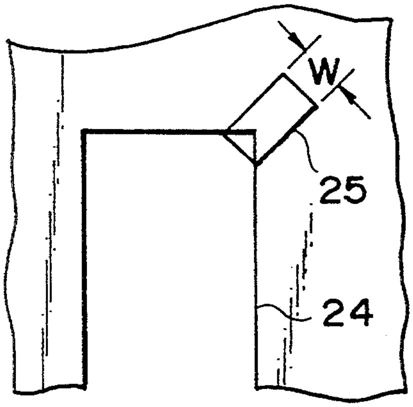
FIGS. 10A to 10D are schematic views for illustrating the respective widths, projection lengths, and projection angles of projecting patterns of smaller- and larger-opening patterns, and projecting positions relative to main patterns.
Figure 10B:
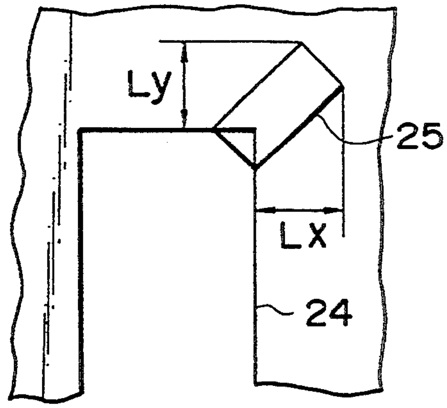
Figure 10C:
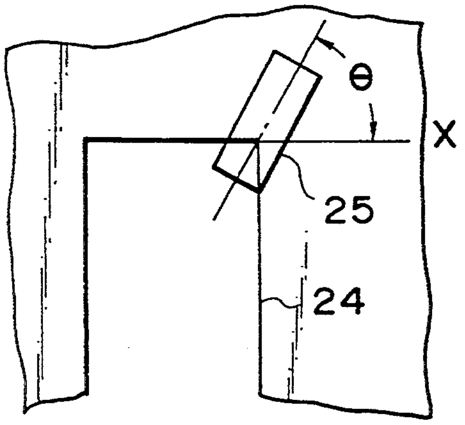
Figure 10D:
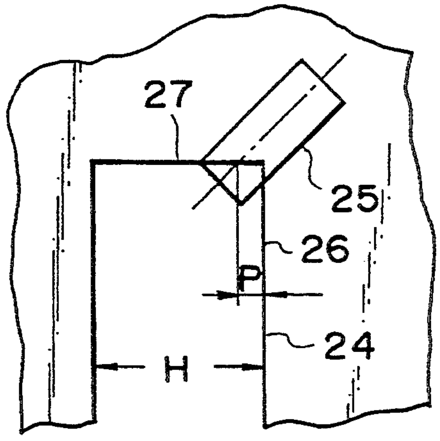
Figure 11A:
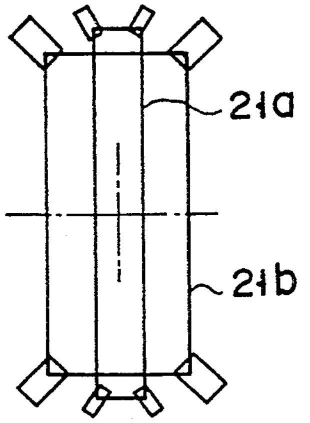
FIGS. 11A to 11D are schematic views showing states in which smaller- and larger-opening patterns are aligned at the center, vertical-axis end, horizontal-axis end, and diagonal-axis end, respectively, of a shadow mask printing negative plate.
Figure 11B:
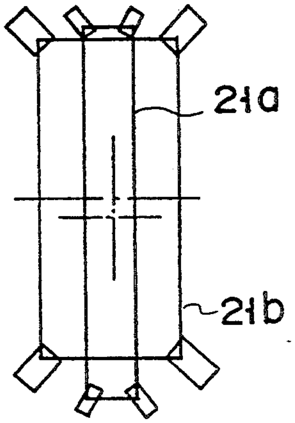
Figure 11C:
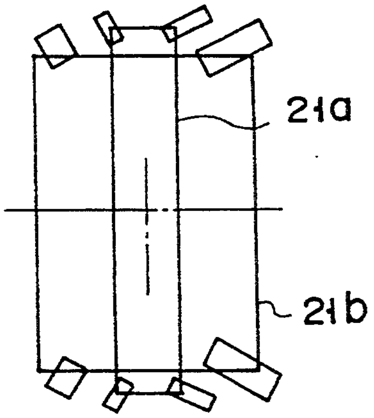
Figure 11D:
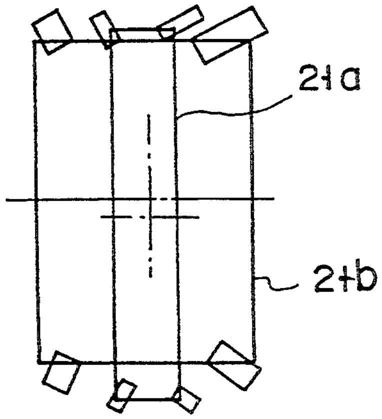

FIG. 9A shows each smaller-opening pattern 21*a* of the negative plate 20*a* including a rectangular main pattern 24*a* and rectangular projecting patterns 25*a*1, 25*a*2, 25*a*3 and 25*a*4 protruding individually from the four corners of the main pattern 24*a*. Likewise, as shown in FIG. 9B, each larger-opening pattern 21*b* of the negative plate 20*b* includes a rectangular main pattern 24*b* and rectangular projecting patterns 25*b*1, 25*b*2, 25*b*3 and 25*b*4 protruding individually from the four corners of the main pattern 24*b*.

The respective widths, projection lengths, projection angles, and projecting positions of these projecting patterns 25*a*1, 25*a*2, 25*a*3, 25*a*4, 25*b*1, 25*b*2, 25*b*3 and 25*b*4 are restricted individually to predetermined values. In FIGS. 10A to 10D, numeral 24 denotes the main pattern of each smaller- or larger-opening pattern, and numeral 25 denotes one of the projecting patterns. If the width W of the projecting patterns 25 of the smaller- or larger-opening patterns is 10 μm or less, the resolution of the photo resist films, formed of, e.g., milk casein and a dichromate, on the mask substrate is insufficient. Accordingly, the projecting patterns 25 of predetermined shapes cannot be formed, so that desired apertures cannot be obtained. If the width W is 100 μm or more, the corners of the apertures are so round that a substantially rectangular luminous region cannot be obtained. Therefore, the width W of the projecting patterns 25 is set within a range given by $10\ \mu m \leqq W \leqq 100\ \mu m$, preferably $20\ \mu m \leqq W \leqq 80\ \mu m$.

If the vertical projection length Ly of the projecting patterns 25 of the smaller- or larger-opening patterns is 0.5 T or more, where T is the thickness of the mask substrate, the amount of etching for the middle portion of each projecting pattern 25 etched in a desired etching time, with respect to the thickness direction, is smaller than those for the distal end portion of the projecting pattern and that portion thereof near the main pattern 24. Although the corners of the smaller and larger openings can be bulged, therefore, those of the apertures cannot be bulged. Thus, in order that the shape of the beam spot on the screen and the shape of the aperture 30 viewed from the path of the electron beams is rectangular, the projection length Ly is set within a range given by $0 \leqq Ly \leqq 0.5\ T$, preferably $0.1\ T \leqq Ly \leqq 0.4\ T$. The horizontal projection length Lx of the projecting patterns 25 can be naturally determined depending on the vertical projection length Ly.

If the angle θ (projection angle) between each projecting pattern and the horizontal axis (X axis) is 90° or more, the bulging direction of the bulging portions 37 at the aperture corners is deviated from a desired direction, and the aperture corners are too round to obtain a substantially rectangular luminous region. Therefore, the angle θ is set within a range given by $0° \leqq \theta \leqq 90°$, preferably $10° \leqq \theta \leqq 80°$.

If P is not less than $(\frac{1}{2})H$, where H is the width of the rectangular main pattern 24 and P is the distance from a long side 26 of the pattern 24 to the crossing point of the center axis of the projecting pattern 25 and a short side 27 of the main pattern 24, the projecting pattern 25 is located too deep inside the main pattern 24 to obtain an aperture of a predetermined configuration. Therefore, the distance P (projecting position) is set within a range given by $0 \leqq P \leqq (\frac{1}{2})H$, preferably $0 \leqq P \leqq (\frac{3}{8})H$.

In the smaller- and larger-opening patterns 21*a* and 21*b* of FIGS. 9A and 9B defined as aforesaid, the projecting patterns 25*a*1, 25*a*2, 25*a*3 and 25*a*4 and the patterns 25*b*1, 25*b*2, 25*b*3 and 25*b*4 are arranged symmetrically with respect to the horizontal axis (X axis) of the main patterns 24*a* and 24*b* and asymmetrically with respect to the vertical axis. In the shadow mask printing negative plates 20*a* and 20*b* used for the manufacture of the shadow mask 4 mentioned before, the projecting patterns 25*a*1, 25*a*2, 25*a*3 and 25*a*4 and the patterns 25*b*1, 25*b*2, 25*b*3 and 25*b*4 are arranged symmetrically with respect to the longitudinal and transverse directions of the main patterns 24*a* and 24*b*, symmetrically and asymmetrically with respect to the longitudinal and transverse directions, respectively, and asymmetrically with respect to the longitudinal and transverse directions. These patterns are optimally distributed in four regions of each printing negative plate divided by the horizontal and vertical axes, and this distribution is symmetrical with respect to the horizontal and vertical axes.

Specifically, the smaller- and larger-opening patterns 21*a* and 21*b* include the projecting patterns, which protrude symmetrically with respect to the longitudinal and transverse directions from the four corners of their corresponding main patterns, on the vertical axis passing through the center of each shadow mask printing negative plate and in the vicinity thereof. The patterns are formed symmetrical with respect to the longitudinal direction and asymmetrical with respect to the transverse direction so that the outer projecting patterns 25*a*1 and 25*a*2 or 25*b*1 and 25*b*2 project longer than the inner projecting patterns with distance along the horizontal axis Y from the center of the negative plate, in order to prevent a cutout of each luminous region attributable to a collision of electron beams, which diagonally traverse the apertures of the shadow mask as the deflection increases with distance along the horizontal axis Y from the center of the negative plate.

Those patterns situated on an intermediate axis, e.g., the diagonal axis D, of each shadow mask printing negative plate are formed asymmetrical with respect to the longitudinal and transverse directions so that those outer projecting patterns remoter from the center of the negative plate project longer than those outer projecting patterns nearer to the plate center.

Figure 12A:
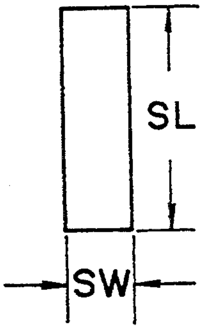
FIGS. 12A to 12E are schematic views individually showing processes for forming a smaller-opening pattern.
Figure 12B:
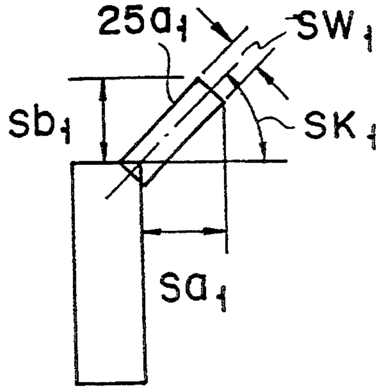
Figure 12C:
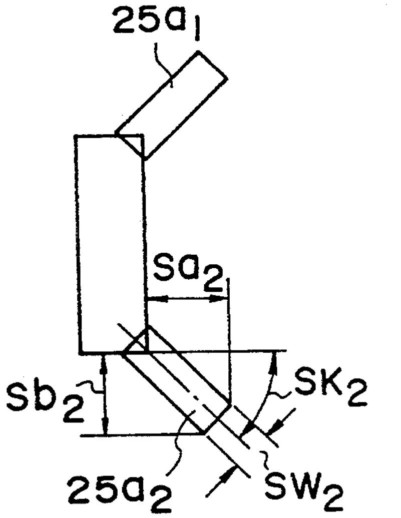
Figure 12D:
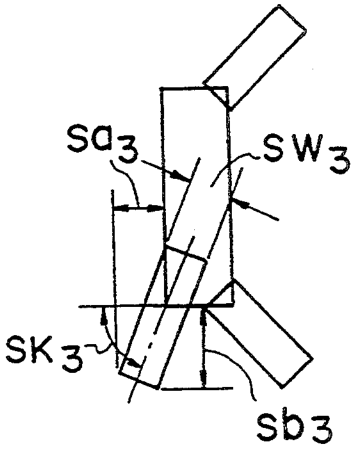
Figure 12E:
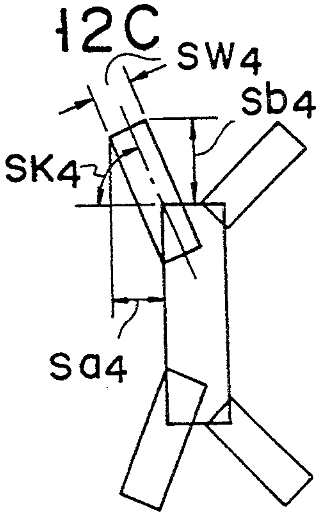

The following is a description of shadow mask printing negative plates of a 25-inch color cathode ray tube as a specific example. In these negative plates, a rectangular main pattern 24*a* of a smaller-opening negative plate 20*a* has a length of 0.87 mm and a width of 0.11 mm at the central portion of the plate and 0.15 mm at the outer peripheral portion with respect to the horizontal direction. A rectangular main pattern 24*b* of a larger-opening negative plate 20*b* has a length of 0.75 mm and a width of 0.33 mm at the central portion of the plate and 0.525 mm at the outer peripheral portion with respect to the horizontal direction. Projecting patterns are formed individually at the four corners of each main pattern in relationships shown in Table 1.

main pattern 24*a* for length sb4 in the longitudinal direction of the main pattern 24*a* and for length sa4 in the transverse direction, as shown in FIG. 12E. Thus, a latent image of one smaller-opening pattern 21*a* is formed. After the main pattern 24*a* of this pattern 21*a* and the projecting patterns 25*a*1, 25*a*2, 25*a*3 and 25*a*4 protruding from the main pattern 24*a* are repeatedly exposed throughout the negative plate, they are developed to produce the desired smaller-opening negative plate 20*a*.

Figure 13A:
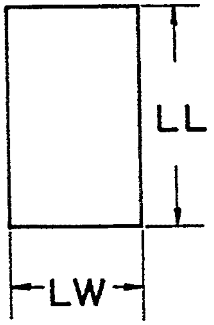

The larger-opening negative plate 20*b* is manufactured in like manner. More specifically, the negative plate 20*b* is exposed to the rectangular main pattern 24*b* with length LL and width Lw, as shown in FIG. 13A. Then, the plate 20*b* is exposed at angle Lk1 to the horizontal axis so that the projecting pattern 25*b*1 with

TABLE 1

| Projecting pattern | | (25a1) (25b1) | | | | (25a2) (25b2) | | | | (25a3) (25b3) | | | | (25a4) (25b4) | | | |
|---|---|---|---|---|---|---|---|---|---|---|---|---|---|---|---|---|---|
| Position | | C | V | H | D | C | V | H | D | C | V | H | D | C | V | H | D |
| Smaller-opening | W | 30 | 30 | 30 | 30 | 30 | 30 | 30 | 30 | 30 | 30 | 30 | 30 | 30 | 30 | 30 | 30 |
| | Ly | 40 | 40 | 40 | 40 | 40 | 40 | 40 | 40 | 40 | 40 | 40 | 40 | 40 | 40 | 40 | 40 |
| | θ | 65 | 65 | 75 | 75 | 65 | 65 | 75 | 75 | 65 | 65 | 25 | 25 | 65 | 65 | 25 | 25 |
| | P | 0 | 0 | 0 | 0 | 0 | 0 | 0 | 0 | 0 | 0 | 0 | 0 | 0 | 0 | 0 | 0 |
| Larger-opening | W | 70 | 70 | 70 | 70 | 70 | 70 | 70 | 70 | 70 | 70 | 70 | 70 | 70 | 70 | 70 | 70 |
| | Ly | 60 | 60 | 60 | 60 | 60 | 60 | 60 | 60 | 60 | 60 | 60 | 60 | 60 | 60 | 60 | 60 |
| | θ | 45 | 45 | 75 | 75 | 45 | 45 | 75 | 75 | 45 | 45 | 25 | 25 | 45 | 45 | 25 | 25 |
| | P | 0 | 0 | $\frac{1}{8}$ | $\frac{1}{8}$ | 0 | 0 | $\frac{1}{8}$ | $\frac{1}{8}$ | 0 | 0 | $\frac{1}{8}$ | $\frac{1}{8}$ | 0 | 0 | $\frac{1}{8}$ | $\frac{1}{8}$ |

In Table 1, positions C, V, H and D indicate the center of each shadow mask printing negative plate, vertical axis end portion, horizontal axis end portion, and diagonal axis end portion, respectively.

FIGS. 11A to 11D show the way the smaller- and larger-opening patterns 21*a* and 21*b* overlap each other at the center C of each shadow mask printing negative plate, vertical axis upper end portion v, horizontal axis right end portion H, and diagonal axis upper-right end portion D, respectively, when the smaller- and larger-opening negative plates 20*a* and 20*b* are properly joined together.

Figure 13B:
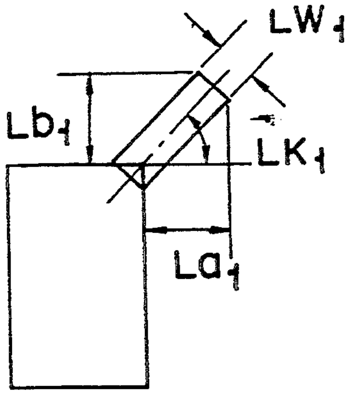
Figure 13C:
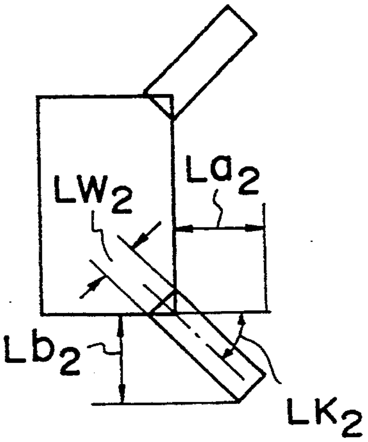
Figure 13D:
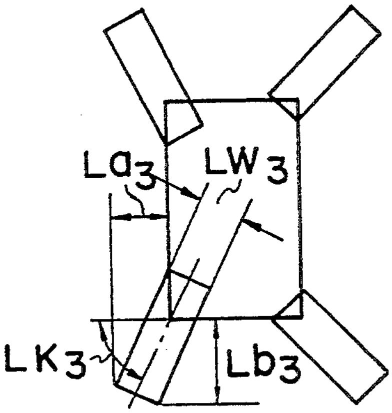
Figure 13E:
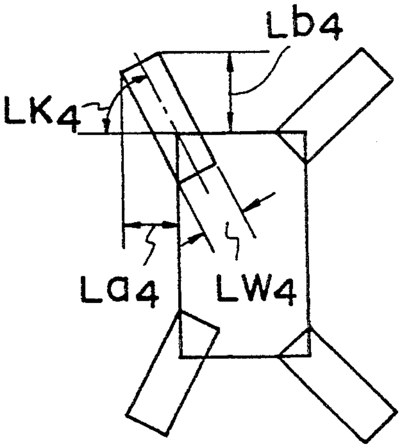

The above-described shadow mask printing negative plates 20*a* and 20*b* are prepared by means of a plotter (e.g., Photoplotter produced by Gerber LTD., U.S.A.) which can draw rectangular patterns. The smaller-opening negative plate 20*a* is manufactured following the steps of procedure shown in FIGS. 12A to 12E. First, the negative plate 20*a* is exposed to a rectangular main pattern 24*a* with length sL and width sw, as shown in FIG. 12A. Then, the plate 20*a* is exposed at angle sk1 to the horizontal axis so that a projecting pattern 25*a*1 with width sw1 projects from a first corner of the main pattern 24*a* for length sb1 in the longitudinal direction of the main pattern 24*a* and for length sa1 in the transverse direction, as shown in FIG. 12B. Subsequently, the plate 20*a* is exposed at angle sk2 to the horizontal axis so that the projecting pattern 25*a*2 with width sw2 projects from a second corner of the main pattern 24*a* for length sb2 in the longitudinal direction of the main pattern 24*a* and for length sa2 in the transverse direction, as shown in FIG. 12C. Then, the plate 20*a* is exposed at angle sk3 to the horizontal axis so that the projecting pattern 25*a*3 with width sw3 projects from a third corner of the main pattern 24*a* for length sb3 in the longitudinal direction of the main pattern 24*a* and for length sa3 in the transverse direction, as shown in FIG. 12D. Further, the plate 20*a* is exposed at angle sk4 to the horizontal axis so that the projecting pattern 25*a*4 with width sw4 projects from a fourth corner of the width Lw1 projects from a first corner of the main pattern 24*b* for length Lb1 in the longitudinal direction of the main pattern 24*b* and for length La1 in the transverse direction, as shown in FIG. 13B. Subsequently, the plate 20*b* is exposed at angle Lk2 to the horizontal axis so that the projecting pattern 2B*b*2 with width Lw2 projects from a second corner of the main pattern 24*b* for length Lb2 in the longitudinal direction of the main pattern 24*b* and for length La2 in the transverse direction, as shown in FIG. 13C. Then, the plate 20*b* is exposed at angle Lk3 to the horizontal axis so that the projecting pattern 25*b*3 with width Lw3 projects from a third corner of the main pattern 24*b* for length Lb3 in the longitudinal direction of the main pattern 24*b* and for length La3 in the transverse direction, as shown in FIG. 13D. Further, the plate 20*b* is exposed at angle Lk4 to the horizontal axis so that the projecting pattern 25*b*4 with width Lw4 projects from a fourth corner of the main pattern 24*b* for length Lb4 in the longitudinal direction of the main pattern 24*b* and for length La4 in the transverse direction, as shown in FIG. 13E. After the main pattern 24*b* and the projecting patterns 25*b*1, 25*b*2, 25*b*3 and 25*b*4 protruding therefrom are repeatedly exposed throughout the negative plate, they are developed to produce the desired larger-opening negative plate 20*b*.

With use of the shadow mask printing negative plates 20*a* and 20*b* formed in this manner, a shadow mask can be formed such that the bulges of the bulging portions 37 vary depending on coordinate positions on the mask, as shown in FIGS. 3A to 5B. According to the manufacturing method described above, the desired shadow mask printing negative plates 20*a* and 20*b* can be manufactured with ease.

Figure 14A:
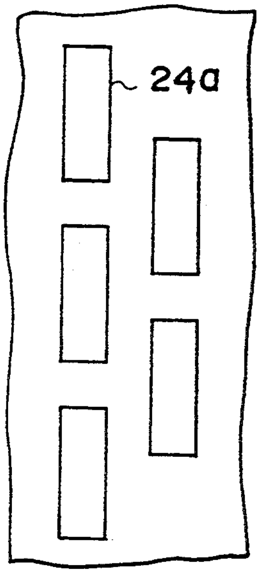
FIGS. 14A to 14E are schematic views showing a modification of processes for forming smaller- or larger-opening patterns.
Figure 14B:
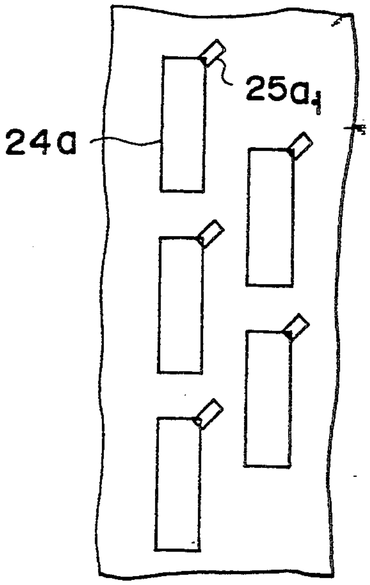
Figure 14C:
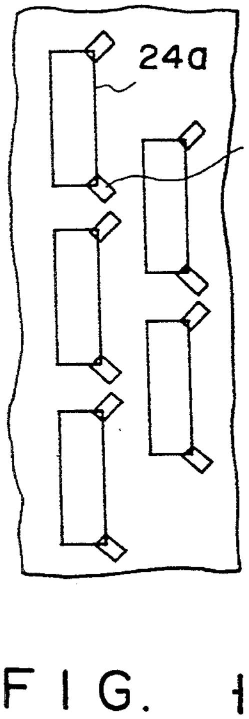
Figure 14D:
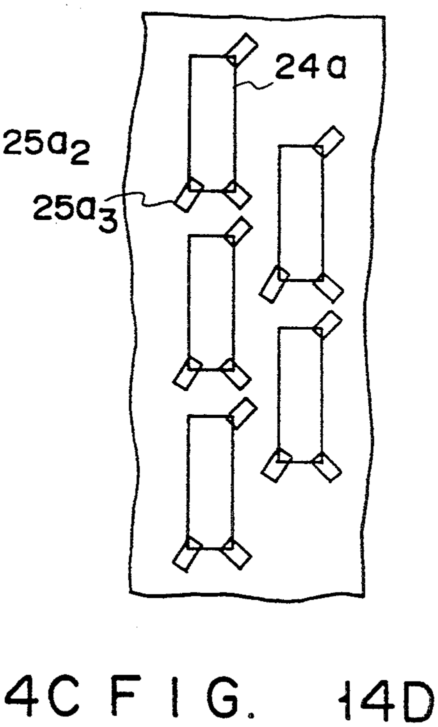
Figure 14E:
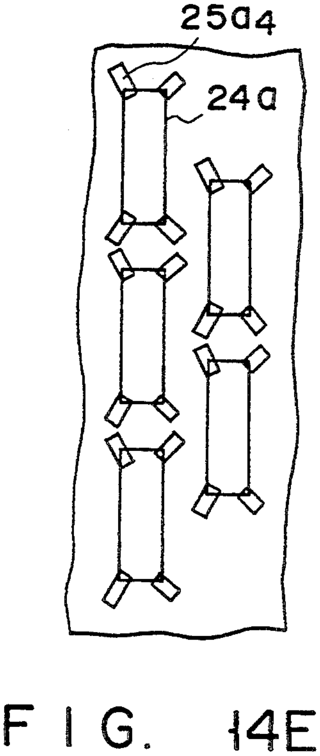

According to the embodiment described above, the four corners of one main pattern are compositely exposed to projecting patterns to form a latent image of a desired smaller- or larger-opening pattern, and smaller- and larger-opening negative plates are produced by repeating this process. Alternatively, however, the printing negative plates may be manufactured by the following method. Each negative plate is previously exposed to all the main patterns 24*a* or 24*b*, as shown in FIG. 14A, and the respective first corners of all these main patterns 24*a* or 24*b* are then exposed to the projecting patterns 25*a*1 or 25*b*1, as shown in FIG. 14B. Subsequently, the respective second to fourth corners of the main patterns 24*a* or 24*b* are successively exposed to the projecting patterns 25*a*2 to 25*a*4 or 25*b*2 to 25*b*4, as shown in FIGS. 14C to 14E.

According to the above-described embodiment, moreover, the shadow mask obtained is an off-center shadow mask in which the positions of the larger-opening patterns are shifted outward, with respect to those of the smaller-opening patterns 35, with distance in the vertical and horizontal directions from the center of the mask when the smaller- and larger-opening negative plates 20*a* and 20*b* are properly joined together with the mask substrate. The present invention may, however, be also applied to a pair of shadow mask printing negative plates in which all of smaller- and larger-opening patterns are fully coaxial with one another.

Figure 15:
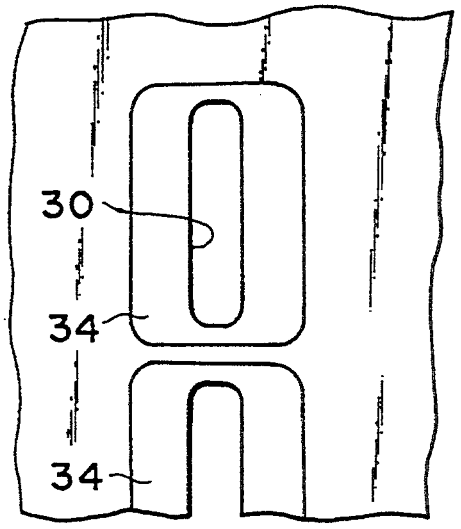
FIG. 15 is a plan view showing apertures having no bulging portions.

In the above embodiment, furthermore, those apertures 30 which are located on or near the vertical axis of the shadow mask 4 have the bulging portions 37 at their four corners each. As shown in FIG. 15, however, the larger openings 34, smaller openings 35, and apertures 30 may alternatively be formed in a rectangular configuration without any bulging portions at the corners. Also in this case, the larger-and smaller-opening patterns of each printing negative plate are designed so as to have projecting patterns protruding individually from the four corners of each main pattern, lest the corners of the apertures formed be rounded.

In the above embodiment, moreover, the farther each of the apertures is located from the horizontal axis, the longer the bulge of the corners of the aperture remoter from the horizontal axis, out of the outer corners, extend outwardly, and those apertures are asymmetrical with respect to the longitudinal and transverse directions. Depending on the type of the color cathode ray tube, however, the bulges of the corners of the apertures may be varied in consideration of only the horizontal distance from the center of the shadow mask, without giving consideration to the distance from the horizontal axis. In other words, all the apertures in a vertical train crossing the horizontal axis of the mask may be formed in the same configuration as the one on the horizontal axis.

Figure 16:
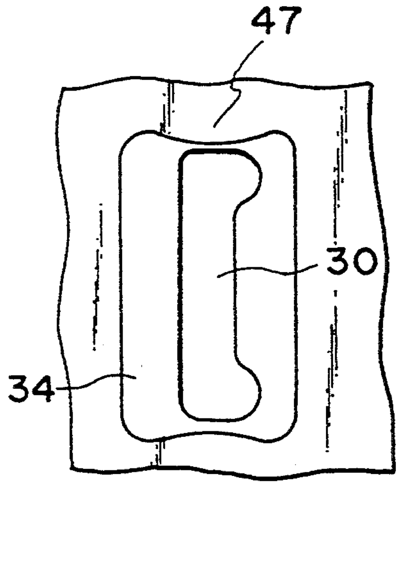
FIGS. 16 and 17 are plan views individually showing different modifications of the shadow mask aperture.
Figure 17:
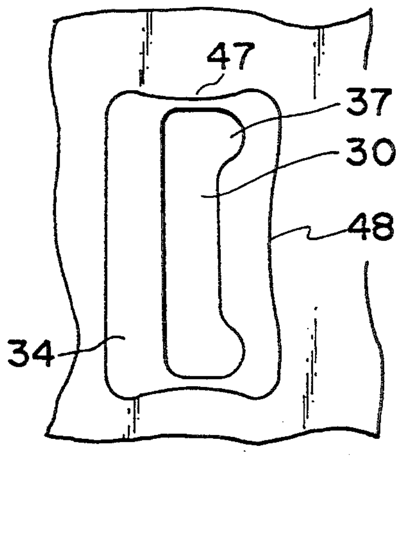

In the embodiment described above, furthermore, the shadow mask is designed so that the respective central portions of the short and long sides of each larger opening 34 are straight, and the corners are bulged. As shown in FIG. 16, however, each larger opening 34 may be shaped so that the central portion of each short side 47 thereof bulges toward the aperture 30. As shown in FIG. 17, moreover, the larger opening 34 may be shaped so that the central portion of each short side 47 thereof bulges toward the aperture 30, and the central portion of that long side 48 thereof on which the bulging portions 37 of the aperture 30 are formed bulges toward the aperture.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A printing negative plate assembly for forming a mask substrate used to generate a shadow mask, said printing negative plate assembly comprising:

a first negative plate having a plurality of larger-opening patterns corresponding to larger openings in said shadow mask, said first negative plate being pasted on one side of said mask substrate; and a second negative plate having a plurality of smaller-opening patterns corresponding to smaller openings in said shadow mask, said second negative plate being pasted on a side of said mask substrate opposing said first negative plate, each of said larger-opening patterns and said smaller-opening patterns having a rectangular main pattern and rectangular projecting patterns, said projecting patterns individually projecting outward from the four corners of said main pattern;

a width and length of projection of said projecting patterns varying based on the coordinate positions of each corresponding main pattern on said negative plates.

2. A negative plate assembly according to claim 1, wherein said main patterns of said first and second negative plates are different in size, said difference in size being based on the coordinate positions thereof on said negative plates.

3. A negative plate assembly according to claim 1, wherein the width W of each of said projecting patterns is set within a range given by $10\ \mu m \leqq W \leqq 100\ \mu m$.

4. A negative plate assembly according to claim 1, wherein the length Ly of projection of each projecting pattern from the main pattern in the longitudinal direction of the main pattern is set within a range given by $0 \leqq Ly \leqq 0.5\ T$, where T is the thickness of the mask substrate.

5. A negative plate assembly according to claim 1, wherein the angle $\theta$ of each projecting pattern to a lateral edge of the main pattern is set within a range given by $0° \leqq \theta \leqq 90°$.

6. A negative plate assembly according to claim 1, wherein a distance P from a long side of the main pattern to a crossing point of a central axis of the projecting pattern and a lateral side of the main pattern is set within a range given by $0 \leqq P \leqq (\frac{1}{2})H$, where H is a width of the main pattern.

7. A method of manufacturing a printing negative plate assembly for forming a mask substrate used to generate a shadow mask, said method comprising the steps of:

exposing a negative film to a rectangular main pattern; and compositely exposing four corners of said main pattern to rectangular projecting patterns, thereby synthetically combining said main pattern with said projecting patterns, wherein said step of compositely exposing said four corners of said main pattern includes the steps of changing a width, a projection length, a projection angle, and a projecting position of each projecting pattern with respect to said main pattern, depending on coordinate positions of each said shadow mask on said negative film.

8. A method according to claim 7, wherein said exposing step includes exposing the negative film to the main pattern of one aperture pattern, and said compositely exposing step includes exposing the corners of said one main pattern to the projecting patterns in succession.

9. A method according to claim 7, wherein said exposing step includes successively exposing the negative film to the respective main patterns of all aperture patterns, and said compositely exposing step includes successively compositely exposing first corners of all the main patterns to a first projecting pattern, then successively compositely exposing second corners of all the main patterns to a second projecting pattern, then successively compositely exposing third corners of all the main patterns to a third projecting pattern, and then successively compositely exposing fourth corners of all the main patterns to a fourth projecting pattern.

10. A printing negative plate assembly for forming a mask substrate used to generate a shadow mask, where vertical and horizontal axes pass through a center of said mask substrate, said negative printing plate assembly comprising:

a first negative plate having a plurality of larger-opening patterns corresponding to larger openings in said shadow mask, said first negative plate being pasted on one side of said mask substrate; and a second negative plate having a plurality of smaller-opening patterns corresponding to smaller openings in said shadow mask, said second negative plate being pasted on a side of said mask substrate opposing said first negative plate;

each of said larger-opening patterns and said smaller-opening patterns having a rectangular main pattern and rectangular projecting patterns, said projecting patterns individually projecting outward from the four corners of said main pattern, each of said main patterns, other than a main pattern located on said vertical axis, having a pair of outer corners which are farther from said vertical axis and a pair of inner corners which are closer to said vertical axis, said projecting patterns including a pair of first patterns and a pair of second patterns, each of said first patterns extending from one of said outer corners and each of said second patterns extending from one of said inner corners, wherein a length of projection of each first pattern increases based on an increase in distance between each respective main pattern from said vertical axis.

* * * * *